(12) United States Patent
Takahashi

(10) Patent No.: US 8,710,642 B2
(45) Date of Patent: Apr. 29, 2014

(54) SEMICONDUCTOR DEVICE, METHOD OF MANUFACTURING SEMICONDUCTOR DEVICE, AND ELECTRONIC APPARATUS

(75) Inventor: Masanori Takahashi, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/424,586

(22) Filed: Mar. 20, 2012

(65) Prior Publication Data

US 2012/0241950 A1    Sep. 27, 2012

(30) Foreign Application Priority Data

Mar. 25, 2011    (JP) .................................. 2011-068175

(51) Int. Cl.
*H01L 23/02* (2006.01)
*H01L 21/00* (2006.01)

(52) U.S. Cl.
USPC ............ 257/686; 257/E25.006; 257/E25.021; 257/E25.027; 257/E23.085; 438/109

(58) Field of Classification Search
USPC ........... 257/686, E25.006, E25.013, E25.021, 257/E25.027, E23.085, 737, 738; 228/180.22; 438/109, FOR. 368, 438/FOR. 426
See application file for complete search history.

(56) References Cited

U.S. PATENT DOCUMENTS

| | | | |
|---|---|---|---|
| 5,222,014 A | 6/1993 | Lin | |
| 6,137,184 A * | 10/2000 | Ikegami | 257/785 |
| 6,828,665 B2 * | 12/2004 | Pu et al. | 257/686 |
| 7,279,786 B2 | 10/2007 | Kim | |
| 7,288,841 B2 | 10/2007 | Yamano | |
| 7,459,339 B2 | 12/2008 | Masumoto | |
| 7,520,052 B2 | 4/2009 | Takahashi et al. | |
| 7,562,446 B2 | 7/2009 | Jung et al. | |
| 7,971,351 B2 | 7/2011 | Takahashi et al. | |
| 2007/0164457 A1 | 7/2007 | Yamaguchi et al. | |
| 2007/0215380 A1 | 9/2007 | Shibamoto | |
| 2007/0290319 A1 | 12/2007 | Kim | |
| 2008/0251913 A1 | 10/2008 | Inomata | |
| 2009/0146301 A1 | 6/2009 | Shimizu et al. | |
| 2009/0283900 A1 | 11/2009 | Yamada | |
| 2010/0147570 A1 | 6/2010 | Fukuda | |
| 2011/0254150 A1 | 10/2011 | Takahashi et al. | |

FOREIGN PATENT DOCUMENTS

| | | |
|---|---|---|
| EP | 1734581 A1 | 12/2006 |
| JP | A-10-144721 | 5/1998 |
| JP | A-2000-260817 | 9/2000 |
| JP | B-3239909 | 12/2001 |
| JP | A-2006-351565 | 12/2006 |
| JP | A-2007-005727 | 1/2007 |
| JP | A-2007-103772 | 4/2007 |
| JP | A-2007-123545 | 5/2007 |
| JP | A-2007-123705 | 5/2007 |
| JP | A-2007-194436 | 8/2007 |

(Continued)

*Primary Examiner* — Jasmine Clark
(74) *Attorney, Agent, or Firm* — Fujitsu Patent Center

(57) ABSTRACT

A semiconductor device includes a first wiring board, a first semiconductor element mounted on the first wiring board, a second wiring board disposed over the first semiconductor element, and a second semiconductor element mounted on the second wiring board. The wiring boards are electrically interconnected by a connecting portion interposed therebetween. A resin layer is formed between the wiring boards such that the first semiconductor element mounted on the first wiring board is sealed and such that the wiring boards having the respective semiconductor elements mounted thereon are bonded together.

7 Claims, 16 Drawing Sheets

(56) References Cited

FOREIGN PATENT DOCUMENTS

| JP | A-2007-250764 | 9/2007 |
| JP | A-2008-71953 | 3/2008 |
| JP | A-2008-533700 | 8/2008 |
| JP | A-2008-218505 | 9/2008 |
| JP | A-2009-141287 | 6/2009 |
| JP | A-2009-152253 | 7/2009 |
| JP | B-4337949 | 9/2009 |
| JP | A-2009-302505 | 12/2009 |
| JP | B-4384157 | 12/2009 |
| JP | A-2010-080609 | 4/2010 |

* cited by examiner

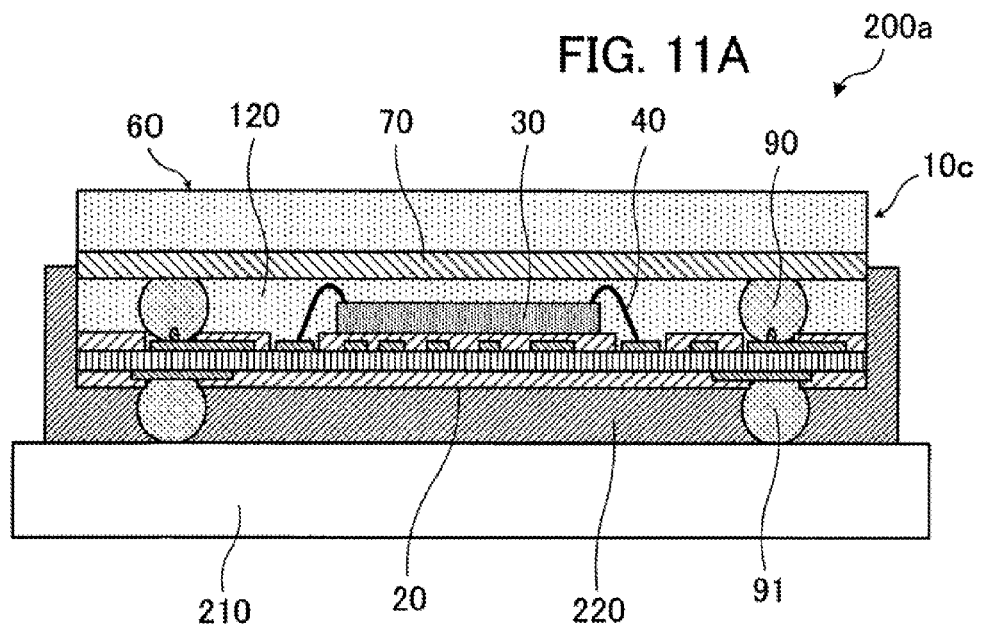
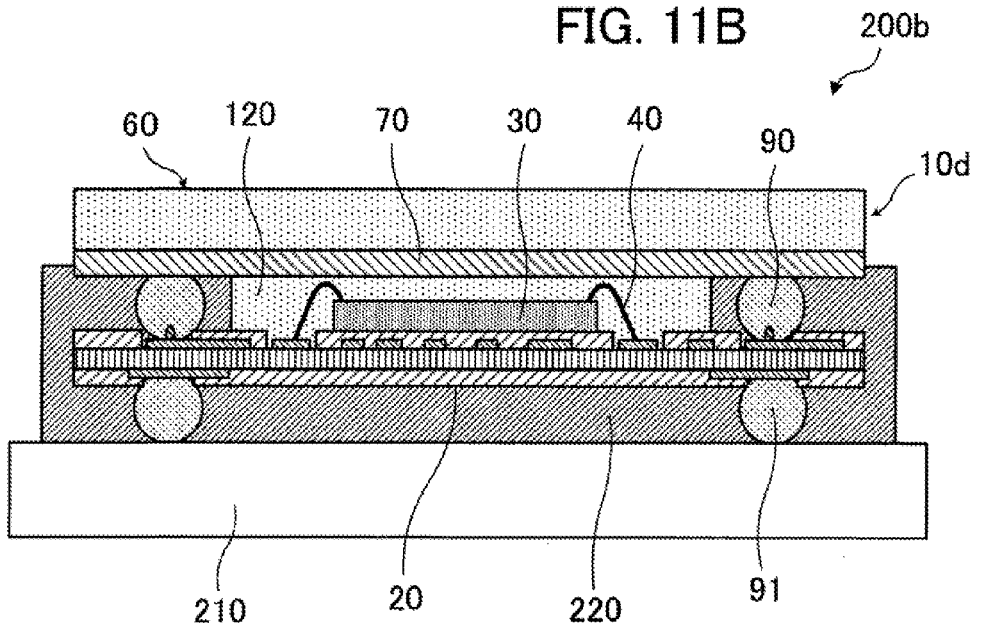

FIG. 14A
FIG. 14B
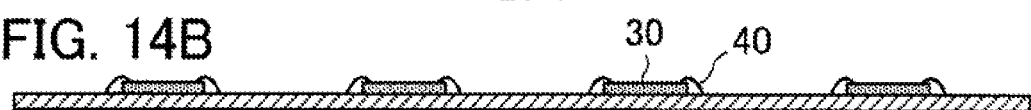
FIG. 14C
FIG. 14D
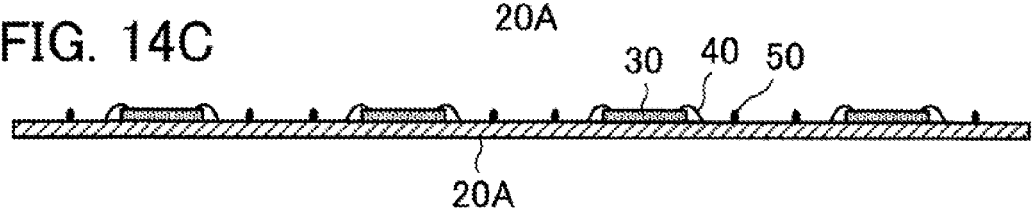
FIG. 14E
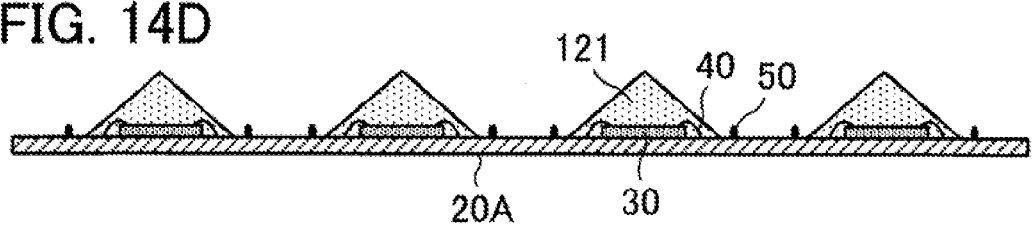
FIG. 14F
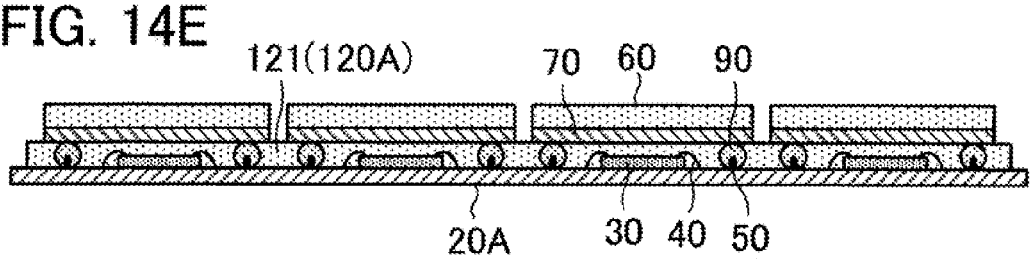
FIG. 14G
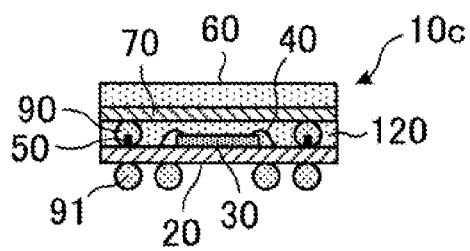

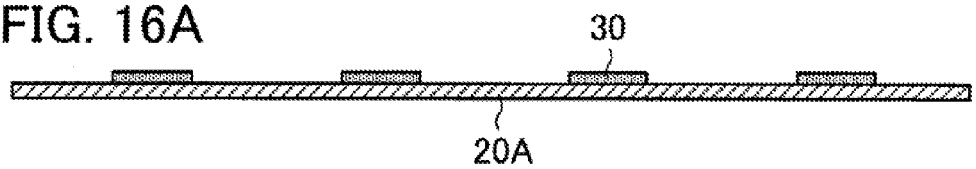
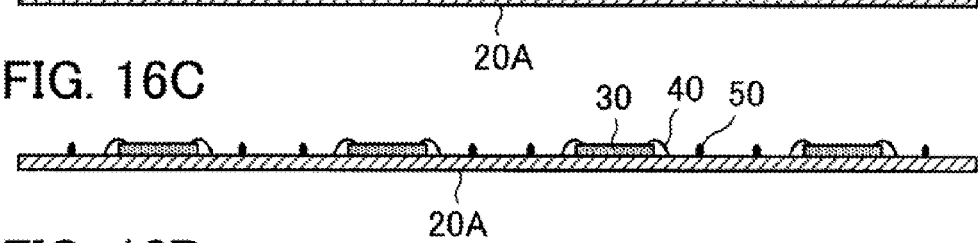
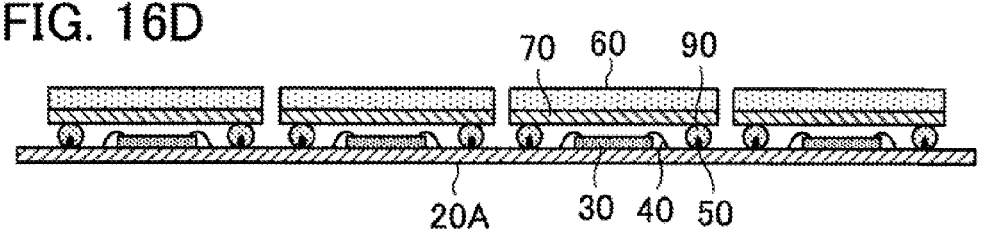
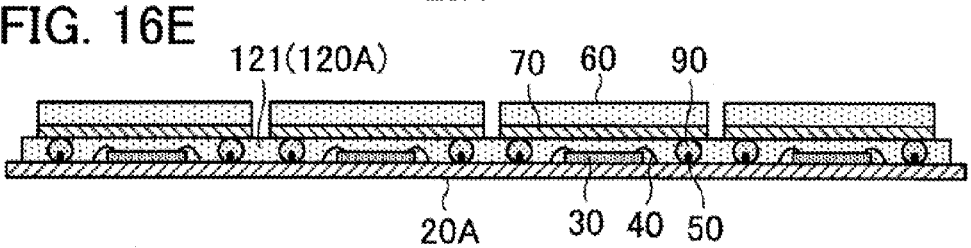
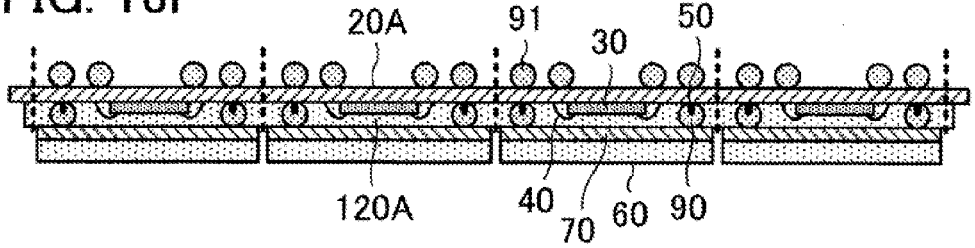
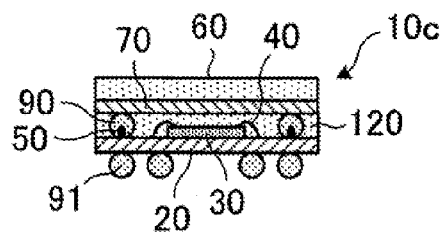

SEMICONDUCTOR DEVICE, METHOD OF MANUFACTURING SEMICONDUCTOR DEVICE, AND ELECTRONIC APPARATUS

CROSS-REFERENCE TO RELATED APPLICATION

This application is based upon and claims the benefit of priority of the prior Japanese Patent Application No. 2011-068175, filed on Mar. 25, 2011, the entire contents of which are incorporated herein by reference.

FIELD

The embodiments discussed herein are related to semiconductor devices, methods of manufacturing semiconductor devices, and electronic apparatuses including semiconductor devices.

BACKGROUND

In semiconductor devices, for example, element units each including a wiring board and a semiconductor element mounted thereon are laminated, and the wiring boards are interconnected by connecting terminals. This well-known mounting method includes, for example, so-called package-on-package (PoP). In the semiconductor devices formed by the PoP method, semiconductor packages each including wiring boards such as package substrates and semiconductor elements (chips) mounted thereon are laminated, and the wiring boards are interconnected by bumps and the like.

Well-known methods of mounting semiconductor elements on wiring boards include, for example, wire connection and flip-chip bonding. Among these, flip-chip bonding may be carried out by, for example, placing a resin layer together with bumps between a semiconductor element and a wiring board, and by melting the bumps and the resin layer. In addition, a semiconductor element may be mounted on a wiring board by connecting bumps deposited on the semiconductor element to columnar electrodes formed on the wiring board (see, for example, Japanese Patent Nos. 3239909 and 4337949 and Japanese Laid-open Patent Publication Nos. 2010-080609 and 2000-260817).

In the semiconductor devices formed by the above-described PoP method, connection failure may occur when the lower and upper semiconductor packages interfere with each other. For example, if a resin layer that seals the semiconductor element of the lower semiconductor package interferes with the wiring board of the upper semiconductor package, connecting terminals such as bumps deposited on the upper wiring board may not be connected to pads on the lower wiring board.

In order to interconnect the lower and upper semiconductor packages using connecting portions including the connecting terminals without such interference between the semiconductor packages, for example, the positions of the pads on the lower wiring board may be raised, or additional electrodes may be provided for the pads. However, either method may lead to an increase in cost. In addition, even when the semiconductor packages are interconnected by the connecting portions, some semiconductor devices in known mounting forms have gaps left between the lower and upper semiconductor packages, and therefore do not have sufficient impact resistance and connection reliability.

SUMMARY

According to one aspect of the present invention, a semiconductor device includes a first wiring board; a first semiconductor element mounted on the first wiring board; a second wiring board disposed over the first semiconductor element; a second semiconductor element mounted on the second wiring board; a connecting portion disposed between the first wiring board and the second wiring board so as to electrically connect the first wiring board and the second wiring board; and a first resin layer disposed between the first wiring board and the second wiring board so as to seal the first semiconductor element and so as to bond the first wiring board and the second wiring board together.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 11A and 11B illustrate example electronic apparatuses;

FIGS. 14A to 14G illustrate a first example method of forming semiconductor devices;

FIGS. 16A to 16G illustrate a third example method of forming semiconductor devices.

DESCRIPTION OF EMBODIMENTS

Figure 1:
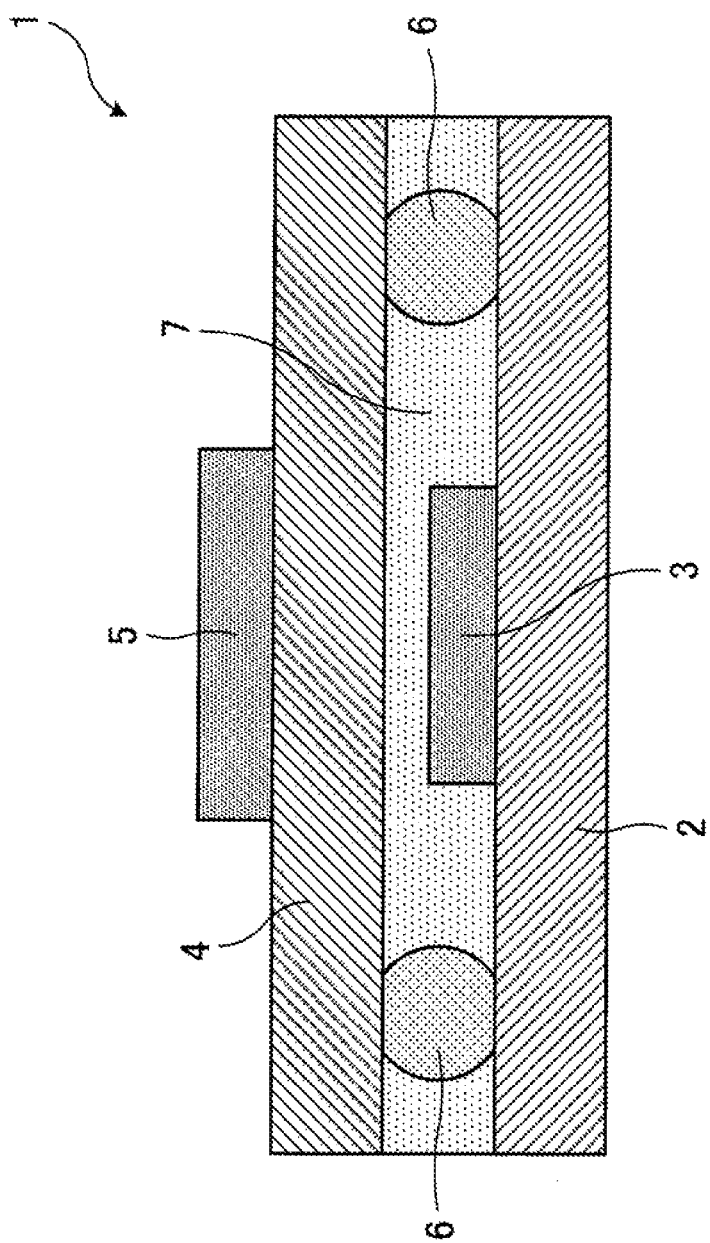
FIG. 1 illustrates an example structure of a semiconductor device.

Several embodiments will be described below with reference to the accompanying drawings, wherein like reference numerals refer to like elements throughout.

FIG. 1 illustrates an example structure of a semiconductor device.

A semiconductor device 1 illustrated in FIG. 1 includes a wiring board 2, a semiconductor element 3 mounted on the wiring board 2, a wiring board 4, and a semiconductor element 5 mounted on the wiring board 4. The semiconductor element 3 is mounted on the wiring board 2 by, for example, wire connection or flip-chip bonding. Similarly, the semiconductor element 5 is mounted on the wiring board 4 by, for example, wire connection or flip-chip bonding.

The lower wiring board 2 and the upper wiring board 4 in the semiconductor device 1 are electrically interconnected by connecting portions 6 interposed therebetween. The connecting portions 6 may be formed of, for example, bumps (protruding electrodes) such as solder balls. Furthermore, a resin layer 7 is disposed between the lower wiring board 2 and the upper wiring board 4 in the semiconductor device 1. The resin layer 7 seals the semiconductor element 3 mounted on the lower wiring board 2, and at the same time, bonds the lower wiring board 2 having the semiconductor element 3 mounted thereon and the upper wiring board 4 having the semiconductor element 5 mounted thereon together.

In this manner, the semiconductor device 1 includes a lower element unit including the wiring board 2 and the semiconductor element 3 mounted thereon, an upper element unit including the wiring board 4 and the semiconductor element 5 mounted thereon, and the connecting portions 6 disposed between the element units so as to electrically connect the element units. The semiconductor element 3 included in the lower element unit is sealed by the resin layer 7, and the resin layer 7 bonds the lower and upper element units together. That is, the resin layer 7 functions as a sealing resin that seals the lower semiconductor element 3, and also functions as an adhesive or an underfill material that bonds the lower and upper element units (wiring boards 2 and 4) together. The semiconductor element 3 is not necessarily sealed by a sealing resin in advance in a semiconductor package to be used as the lower element unit of the semiconductor device 1 before the upper element unit is stacked on the lower element unit.

Connection failure in the semiconductor device 1 having the above-described structure may be avoided since the upper element unit is stackable on the lower element unit without interfering with the lower element unit and is electrically connectable to the lower element unit by the connecting portions 6. Furthermore, connecting portions 6 may achieve high impact resistance and connection reliability since the lower element unit and the upper element unit are bonded together by the resin layer 7 in the semiconductor device 1. In addition, the risk of increasing cost may be reduced since the structures of the wiring boards are not necessarily changed significantly or additional electrodes having predetermined heights are not necessarily disposed on the wiring boards in order to stack the upper element unit on the lower element unit.

The semiconductor device will now be described in more detail.

Figure 2:
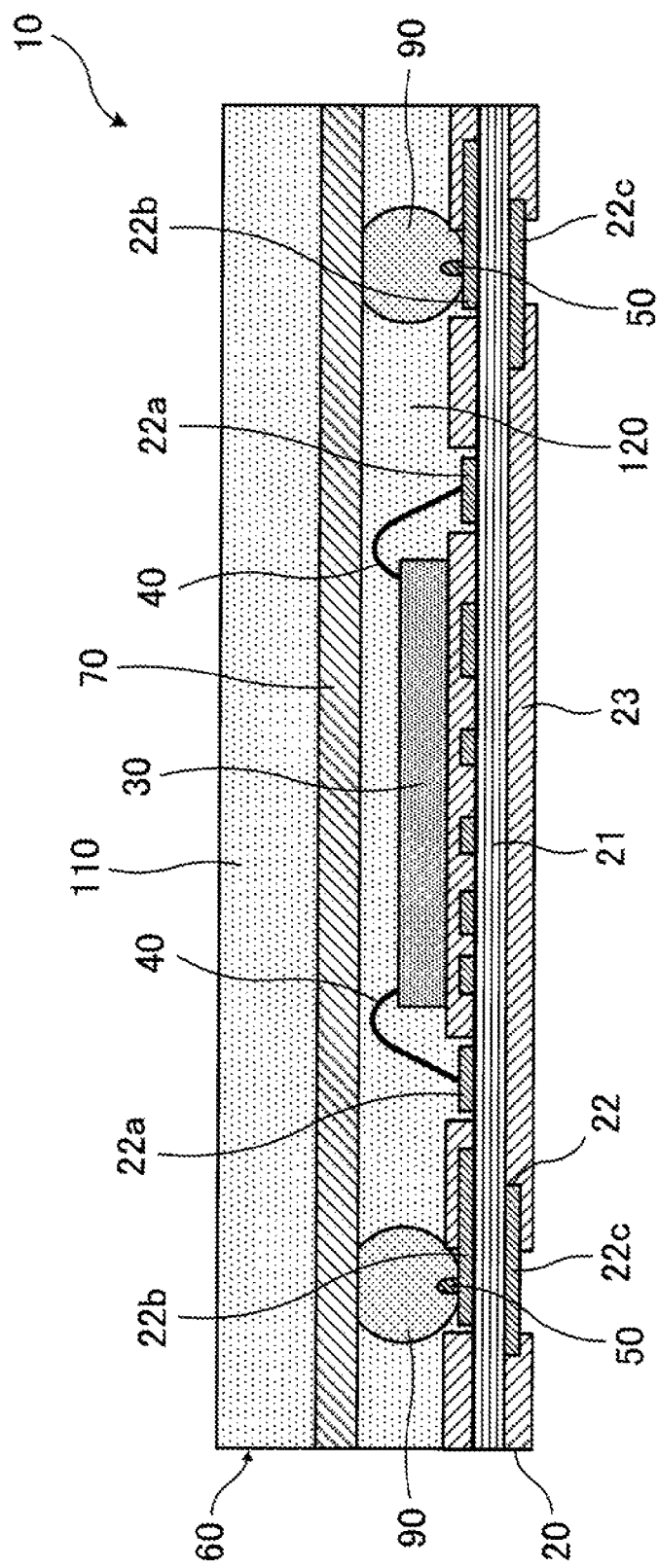
FIG. 2 illustrates a first example semiconductor device.

FIG. 2 illustrates an example semiconductor device. FIG. 2 is a schematic cross-section of a principal part of the example semiconductor device.

A semiconductor device 10 illustrated in FIG. 2 includes a wiring board 20 and a semiconductor element 30 mounted on the wiring board 20.

The wiring board 20 includes a core substrate 21, conductive portions 22 disposed on the top and bottom surfaces of the core substrate 21, and insulating protective films 23. The core substrate 21 may be, for example, a single core layer. Alternatively, the core substrate 21 may be a multi-layered wiring film that includes single-layered or multi-layered conductive portions including wiring patterns disposed on the top and bottom surfaces of a single core layer and insulating portions interposed between the conductive portions, or may have a coreless structure that does not include a core layer. Among the conductive portions 22 of the wiring board 20, some of conductive portions 22a, 22b, and 22c exposed through the protective films 23 on the top and bottom surfaces of the core substrate 21 function as pads (electrode pads).

The semiconductor element 30 is disposed on the wiring board 20, and connected by wires 40 to the conductive portions 22a exposed through the upper protective film 23 at positions outside an area in which the semiconductor element 30 is disposed. In addition, in the example illustrated in FIG. 2, bumps 50 are deposited on the conductive portions 22b exposed through the upper protective film 23 at positions outside the conductive portions 22a connected to the wires 40. These bumps 50 may be, for example, gold (Au) bumps or copper (Cu) bumps.

In the semiconductor device 10, a semiconductor package 60 is stacked over the semiconductor element 30 mounted on the wiring board 20.

Figure 3A:
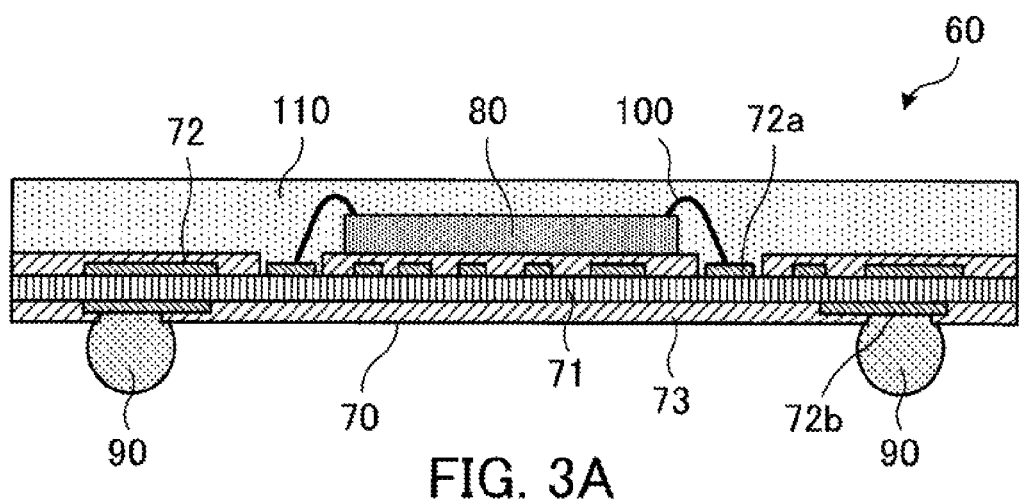
FIGS. 3A and 3B illustrate example semiconductor packages.

FIG. 3A illustrates an example semiconductor package. FIG. 3A is a schematic cross-section of a principal part of the example semiconductor package.

The semiconductor package 60 illustrated in FIG. 3A includes a wiring board 70, a semiconductor element 80 mounted on a main surface (top surface) of the wiring board 70, and bumps 90 deposited on the other main surface (bottom surface) of the wiring board 70 opposite to the main surface on which the semiconductor element 80 is mounted.

The wiring board 70 of the semiconductor package may have a structure similar to that of the wiring board 20. That is, the wiring board 70 includes a core substrate 71, conductive portions 72 disposed on the top and bottom surfaces of the core substrate 71, and insulating protective films 73. The core substrate 71 may be, for example, a single core layer or a multi-layered wiring film including single-layered or multi-layered conductive portions disposed on the top and bottom surfaces of a core layer and insulating portions interposed between the conductive portions. Among the conductive portions 72 of the wiring board 70, some of conductive portions 72a and 72b exposed through the protective films 73 on the top and bottom surfaces of the core substrate 71 function as pads.

In the semiconductor package 60 illustrated in FIG. 3A, the semiconductor element 80 is mounted on the main surface (top surface) of the wiring board 70, and is connected by wires 100 to the conductive portions 72a exposed through the upper protective film 73 at positions outside an area in which the semiconductor element 80 is disposed. The semiconductor element 80 and the wires 100 are sealed by a resin layer 110. The bumps 90 are deposited on the conductive portions 72b, disposed on the other main surface (bottom surface) of the wiring board 70 opposite to the main surface on which the semiconductor element 80 is mounted, exposed through the lower protective film 73. These bumps 90 may be, for example, solder balls.

As an example, FIG. 2 illustrates the wiring board 70, the bumps 90, and the resin layer 110 included in the semiconductor package 60 having the structure as illustrated in FIG. 3A.

The semiconductor package 60 is disposed over the semiconductor element 30 mounted on the wiring board 20, and the bumps 90 deposited on the conductive portions 72b of the wiring board 70 are connected to the bumps 50 deposited on the conductive portions 22b of the wiring board 20 or to both the bumps 50 and the conductive portions 22b. In the example illustrated in FIG. 2, the bumps 50 of the lower wiring board 20 are embedded in the bumps 90 of the upper wiring board 70. By the connection of the bumps 90 to the bumps 50, the semiconductor package (upper element unit) is electrically connected to the lower element unit in which the semiconductor element 30 is mounted on the wiring board 20.

The semiconductor device 10 illustrated in FIG. 2 further includes a resin layer 120 between the lower wiring board 20 and the upper wiring board 70. The resin layer 120 seals the semiconductor element 30 mounted on the lower wiring board 20, and bonds the lower wiring board 20 and the upper wiring board 70 together. That is, in the semiconductor device 10, the lower element unit (semiconductor package) in which the semiconductor element 30 is mounted on the wiring board 20 and the semiconductor package 60 serving as the upper element unit are bonded together by the resin layer 120 while the upper element unit is stacked on the lower element unit.

The semiconductor device 10 having the above-described structure may be formed by, for example, the following method.

FIGS. 4A to 4E illustrate an example method of forming a semiconductor device. FIG. 4A to 4E are schematic cross-sections of principal parts in semiconductor-device formation steps.

Figure 4A:
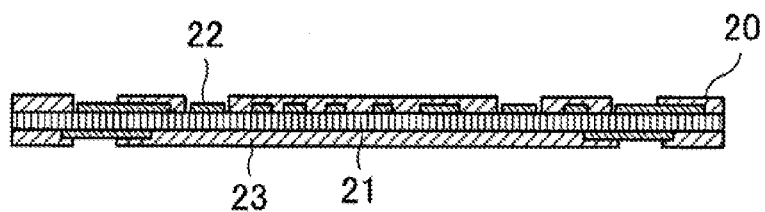
FIGS. 4A to 4E illustrate a first example method of forming a semiconductor device.

Upon the formation of the semiconductor device 10, the wiring board 20 as illustrated in FIG. 4A, for example, is prepared. The wiring board 20 is formed by, for example, build-up technology. The core substrate 21 (or the core layer inside the core substrate 21) of the wiring board 20 may be composed of, for example, ceramic, metal, or prepreg. The conductive portions (including conductive portions inside the core substrate 21 if any in addition to the conductive portions 22) of the wiring board 20 may be composed of, for example, Cu. The insulating portions (including insulating portions inside the core substrate 21 if any in addition to the protective films 23) of the wiring board 20 may be composed of, for example, a resin material such as polyimide resin or epoxy resin.

Figure 4B:
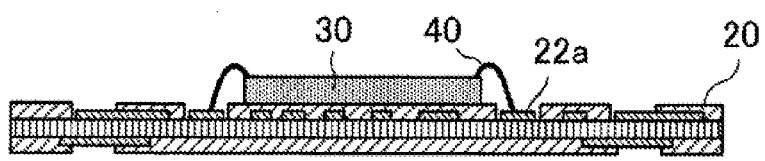

After the preparation of the wiring board 20, the semiconductor element 30 is mounted on the wiring board 20 as illustrated in FIG. 4B. For example, the semiconductor element 30 is disposed in a predetermined area of the wiring board 20 using, for example, a die attach material (not illustrated), and is connected to the conductive portions 22a of the wiring board 20 using the wires 40 composed of, for example, Au.

Figure 4C:
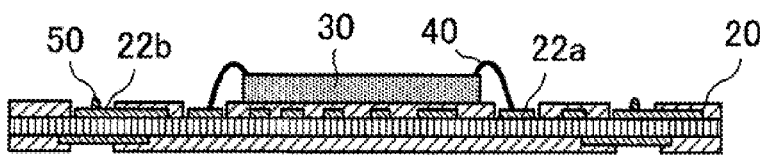

In this example, the relatively small bumps 50 (for example, smaller than the bumps 90 of the semiconductor package 60) or the bumps 50 having relatively small end portions (similarly, smaller than the bumps 90 of the semiconductor package 60, for example) are deposited on the conductive portions 22b disposed on a surface of the wiring board 20, the semiconductor element 30 being mounted on the surface as illustrated in FIG. 4C. This makes the bumps 50 to be easily connected to the bumps 90 of the semiconductor package 60 during pressure-bonding of the semiconductor package 60 (described below), more specifically, makes the bumps 50 to easily bite into the bumps 90.

The bumps 50 may be, for example, Au bumps. The Au bumps may be Au stud bumps formed by connecting ends of Au wires to the conductive portions 22b and then by cutting the wires. The Au stud bumps may be formed using the same device as that used for connection using the wires 40, and may be formed during, for example, the connection using the wires 40.

In addition, the bumps 50 may be Cu stud bumps or Cu posts. The Cu stud bumps may be formed on the conductive portions 22b using Cu wires as are the Au stud bumps after the semiconductor element 30 is mounted on the wiring board 20. The Cu posts may be formed on the conductive portions 22b by, for example, plating during the preparation of the wiring board 20.

Figure 4D:
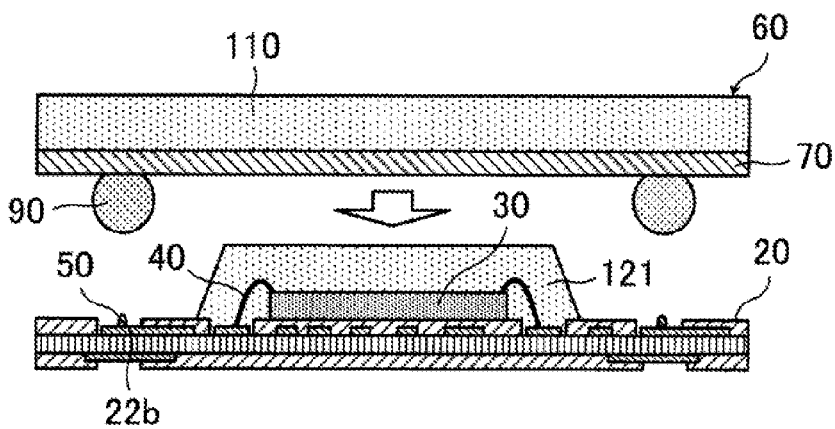

After the connection using the wires 40 and the formation of the bumps 50, a predetermined amount of a resin material 121 is supplied (applied) on the wiring board 20 as illustrated in FIG. 4D. The resin material 121 may be one of those available for the resin layer 120 described with reference to FIG. 2. That is, the resin material 121 may be a material capable of sealing the semiconductor element 30 mounted on the wiring board 20 and capable of bonding the wiring board 20 to the wiring board 70 disposed over the wiring board 20 (described below).

Various materials, for example, thermosetting resins such as epoxy resin and phenol resin, thermoplastic resins, and ultraviolet curable resins, may be used as the resin material 121. In addition, materials (resin compounds) composed of such resins and non-conductive fillers may also be used as the resin material 121. The resin material 121 to be supplied may be liquid or powdered.

After the resin material 121 is supplied on the wiring board 20, the semiconductor package 60 prepared in advance is disposed on the wiring board 20 such that the bumps 90 and the conductive portions 22b are aligned with each other, and is pressure-bonded to the wiring board 20 while, for example, the components are heated at a predetermined temperature.

The temperature at which the semiconductor package 60 is heat-bonded may be set such that the bumps 90 are sufficiently softened for the bumps 50 of the wiring board 20 to bite into the bumps 90, for example, for the bumps 50 to break through oxide films potentially generated on the surfaces of the bumps 90. Furthermore, the temperature at which the semiconductor package 60 is heat-bonded may be set such that the resin remains fluid and is not cured in cases where the resin material 121 is liquid or such that the resin is melted and becomes fluid in cases where the resin material 121 is powdered. When the semiconductor package 60 is heat-bonded to the wiring board 20, conditions such as temperature and pressure (load) during the heat-bonding are set on the basis of combinations of the materials of the resin material 121 and the bumps 50 and 90.

Figure 4E:
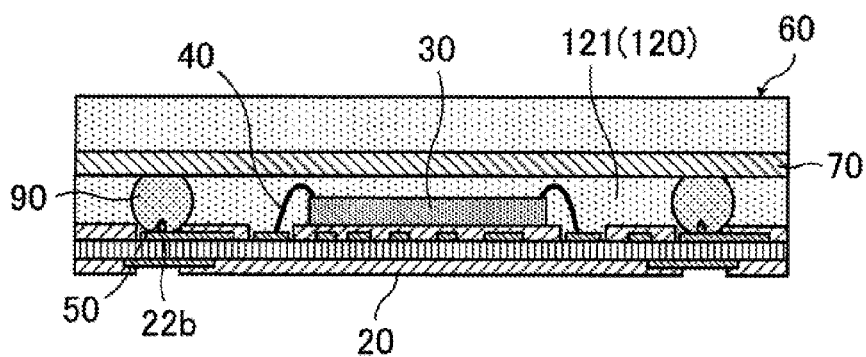

As illustrated in FIG. 4E, the bumps 50 of the wiring board 20 bite into the bumps 90 of the semiconductor package 60 when the semiconductor package 60 is pressure-bonded to the wiring board 20 under predetermined conditions. With this, the bumps 90 are connected to the bumps 50 or both the bumps 50 and the conductive portions 22b, and thus the wiring board 70 of the semiconductor package 60 is electrically connected to the wiring board 20. The use of the bumps 50 ensures a certain reliability of the connection between the wiring boards 20 and 70.

During the pressure-bonding, the fluid resin material 121 supplied in the step illustrated in FIG. 4D or the resin material 121 that was melted and became fluid after being supplied is pressed by the semiconductor package 60, and fills the space between the wiring boards and 70 as illustrated in, for example, FIG. 4E. To this end, a predetermined amount of the resin material 121 is supplied in the step illustrated in FIG. 4D such that the structure as illustrated in FIG. 4E (structure in which the resin material 121 fills the space between the wiring boards 20 and 70) is obtained.

In order to avoid incomplete electrical connection between the bumps 90 and 50 caused when the resin material 121 covers the bumps 50 before the bumps 90 and 50 are connected, dams, for blocking flows of the resin material, composed of a predetermined material and having predetermined dimensions may be formed adjacent to the bumps 50 on the wiring board 20 at positions where the resin material 121 is to be supplied. This further ensures the electrical connection between the bumps 90 and 50.

The resin material 121 filling the space between the wiring boards 20 and 70 as above forms the resin layer 120 when cured. With this, the semiconductor element 30 is sealed by the resin layer 120, and the wiring boards 20 and 70 are bonded together by the resin layer 120.

The resin material 121 may be cured by being heated during heat-bonding of the semiconductor package 60, by being cooled after the heating, or by being irradiated with, for example, ultraviolet rays depending on the properties of the material. The resin material 121 may also be cured by a curing process after pressure-bonding of the semiconductor package 60 depending on the properties of the material.

In addition, after the pressure-bonding of the semiconductor package 60, the bumps 90 may be reflowed so as to wet and spread to the peripheries of the bumps 50 and onto the conductive portions 22b. In cases where the bumps 90 are reflowed such that the bumps 50 bite into the bumps 90, a certain wettability of the bumps 50 and the conductive portions 22b by the bumps 90 is ensured without using flux.

In this manner, the semiconductor device 10 illustrated in FIG. 2 may be formed by the method as illustrated in FIGS. 4A to 4E.

The semiconductor device 10 may also be formed by the following method.

FIGS. 5A to 5E illustrate another example method of forming a semiconductor device. FIGS. 5A to 5E are schematic cross-sections of principal parts in semiconductor-device formation steps.

Figure 5A:
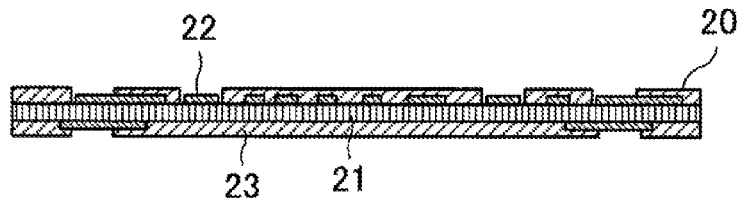
FIGS. 5A to 5E illustrate a second example method of forming a semiconductor device.
Figure 5B:
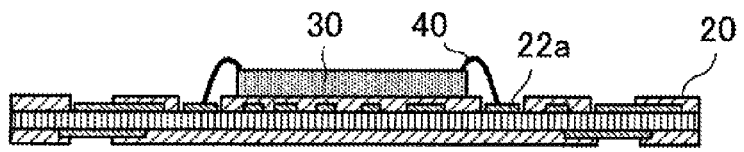
Figure 5C:
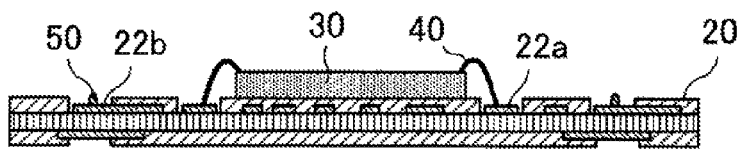

Among the formation steps illustrated in FIGS. 5A to 5E, the steps illustrated in FIGS. 5A to 5C may be performed as are those illustrated in FIGS. 4A to 4C. That is, after the preparation of the wiring board 20 (FIG. 5A), the semiconductor element 30 is disposed on the wiring board 20, and is connected to the wiring board 20 by the wires 40 (FIG. 5B). The bumps 50 are then formed on the conductive portions 22b of the wiring board 20 (FIG. 5C).

Figure 5D:
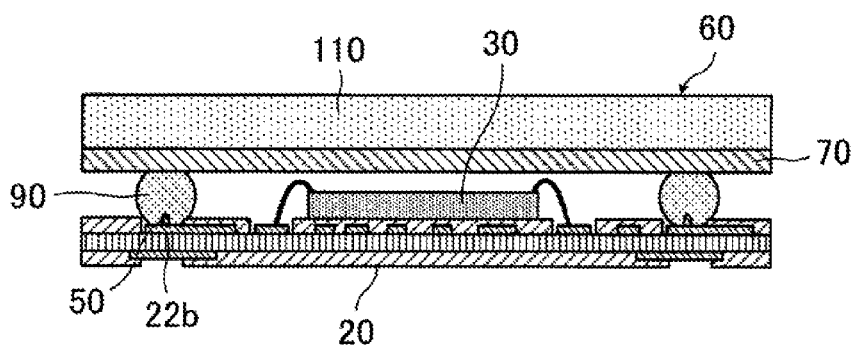

Subsequently, as illustrated in FIG. 5D, the semiconductor package 60 prepared in advance is disposed on the wiring board 20 such that the bumps 90 and the conductive portions 22b are aligned with each other, and is pressure-bonded to the wiring board 20 under predetermined conditions. When the semiconductor package 60 is heat-bonded, the temperature at the moment may be set such that, for example, the bumps 90 of the semiconductor package 60 are sufficiently softened for the bumps 50 of the wiring board 20 to bite into the bumps 90.

Pressure-bonding of the semiconductor package 60 to the wiring board 20 under the predetermined conditions allows the bumps 50 of the wiring board 20 to bite into the bumps 90 of the semiconductor package 60 as illustrated in FIG. 5D. With this, the wiring board 70 of the semiconductor package 60 is electrically connected to the wiring board 20. When the semiconductor package 60 is pressure-bonded to the wiring board 20 or after the pressure-bonding, the bumps 90 may be reflowed so as to wet and spread to the peripheries of the bumps 50 and onto the conductive portions 22b.

Figure 5E:
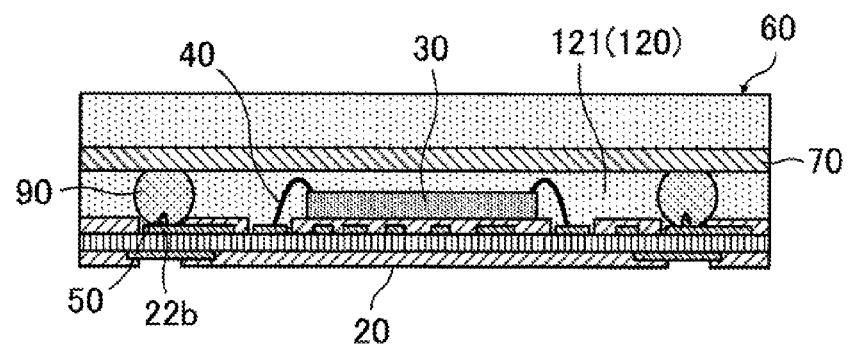

After the semiconductor package 60 is connected to the wiring board 20, the resin material 121 is supplied to the space between the wiring board 20 and the wiring board 70 of the semiconductor package 60 so as to fill the space as illustrated in FIG. 5E. The resin material 121 forms the resin layer 120 when cured. With this, the semiconductor element 30 is sealed by the resin layer 120, and the wiring boards 20 and 70 are bonded together by the resin layer 120. The resin material 121 may be subjected to an additional curing process depending on the properties of the material.

In this manner, the semiconductor device 10 illustrated in FIG. 2 may also be formed by the method as illustrated in FIGS. 5A to 5E.

The methods illustrated in FIGS. 4A to 4E and 5A to 5E may avoid or minimize the interference between the lower element unit including the wiring board 20 and the semiconductor element 30 mounted thereon and the semiconductor package 60 serving as the upper element unit when the upper element unit is stacked on the lower element unit.

For comparison, semiconductor devices of other forms and methods of forming the semiconductor devices will be described with reference to FIGS. 6A to 6C, 7A to 7C, and 8A to 8C.

Figure 6A:
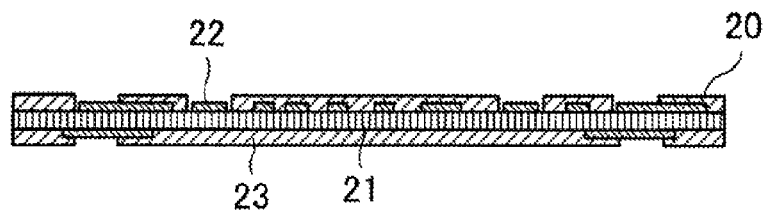
FIGS. 6A to 6C illustrate a method of forming a semiconductor device of another form and the resultant semiconductor device.
Figure 6B:
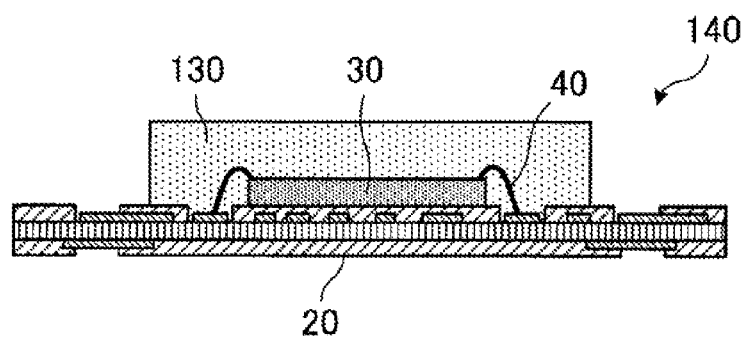
Figure 6C:
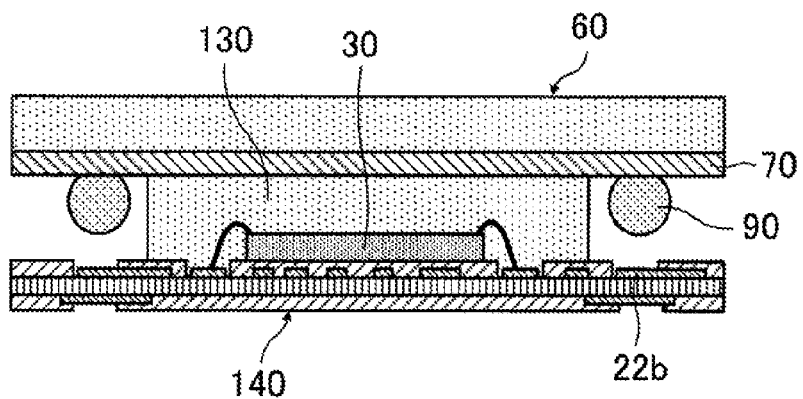

FIGS. 6A to 6C illustrate a method of forming a semiconductor device of another form and the resultant semiconductor device.

In the method illustrated in FIGS. 6A to 6C, the wiring board 20 is prepared as illustrated in FIG. 6A first. The semiconductor element 30 is disposed on the wiring board 20, and is connected to the wiring board 20 by the wires 40 as illustrated in FIG. 6B. Subsequently, the semiconductor element 30 and the wires 40 are sealed by a resin layer 130. After a lower element unit (semiconductor package) 140 is formed in this manner, the semiconductor package 60 prepared in advance is connected to the semiconductor package 140.

In this method, the height of the bumps 90 of the upper semiconductor package 60 needs to be larger than at least the height of the resin layer 130 of the lower semiconductor package 140. If this condition is not satisfied, the wiring board 70 of the upper semiconductor package 60 interferes with the resin layer 130 of the lower semiconductor package 140, and the bumps 90 of the semiconductor package 60 are not connected to the conductive portions 22b of the wiring board 20 as illustrated in FIG. 6C.

Although not illustrated, similar connection failure may occur if the distance between the wiring boards 20 and 70 is increased due to deformation such as warps of the semiconductor packages 60 and 140 even when the bumps 90 and the resin layer 130 satisfy the condition of the heights.

Such connection failure caused by the interference may be avoided by increasing the size of the bumps 90 or by reducing the thickness of the semiconductor element 30 and that of the resin layer 130. However, it may be difficult to increase the size of the bumps 90 due to finer pitches of the bumps 90 and resulting miniaturization. In addition, it may be difficult to further reduce the thickness of the semiconductor element 30 and that of the resin layer 130.

To avoid the connection failure caused by the interference, methods illustrated in FIGS. 7A to 7C and 8A to 8C may be adopted.

FIGS. 7A to 7C and 8A to 8C illustrate example methods of forming semiconductor devices of other forms and the resultant semiconductor devices.

Figure 7A:
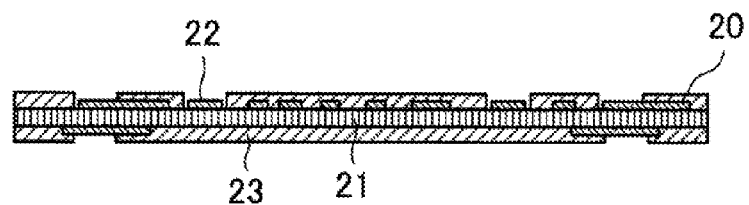
FIGS. 7A to 7C illustrate a first example method of forming a semiconductor device of another form and the resultant semiconductor device.
Figure 7B:
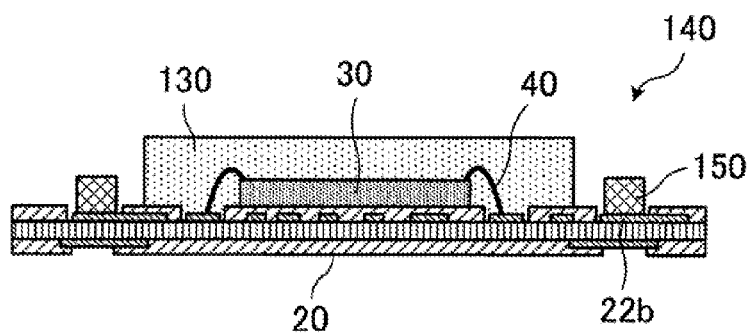
Figure 7C:
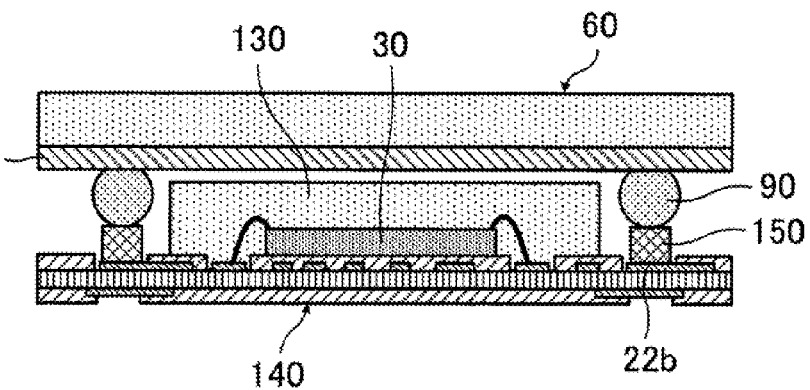

In the example illustrated in FIGS. 7A to 7C, the wiring board 20 is prepared (FIG. 7A) first, and the semiconductor element 30 mounted on the wiring board 20 is sealed by the resin layer 130 so that the semiconductor package 140 is formed, and an electrode layer 150 composed of, for example, solder and having a predetermined height is formed on the conductive portions 22b (FIG. 7B). Subsequently, the bumps 90 of the semiconductor package 60 prepared in advance are connected to the electrode layer 150 (FIG. 7C). The method illustrated in FIGS. 7A to 7C in which the electrode layer 150 having the predetermined height is formed in advance reduces the risk of connection failure caused by the interference between the wiring board 70 and the resin layer 130.

Figure 8A:
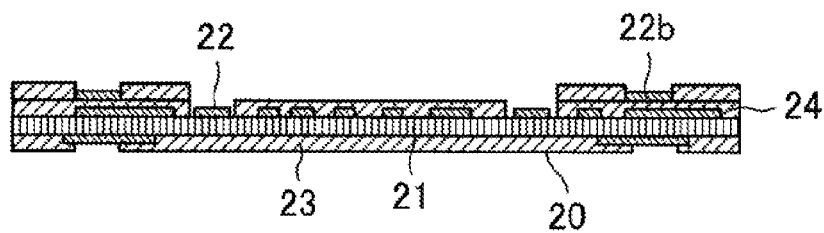
FIGS. 8A to 8C illustrate a second example method of forming a semiconductor device of another form and the resultant semiconductor device.
Figure 8B:
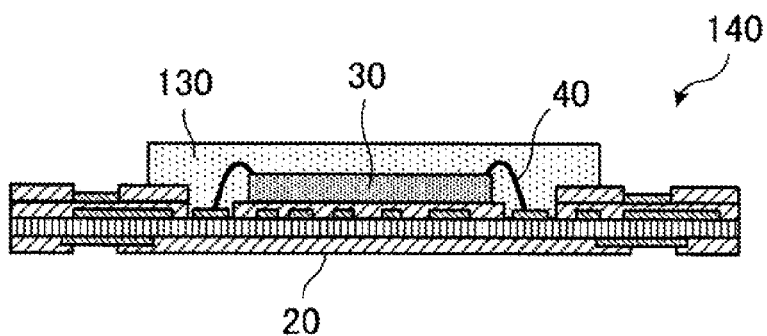
Figure 8C:
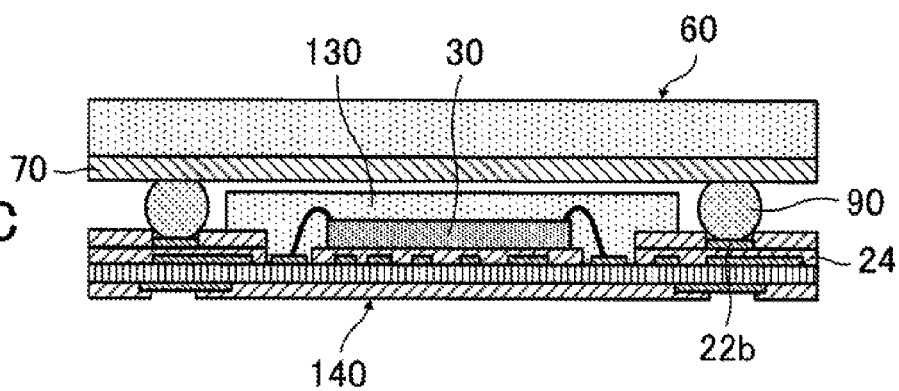

In the example illustrated in FIGS. 8A to 8C, the wiring board 20 including a single-layered or multi-layered film 24 under the conductive portions 22b is prepared (FIG. 8A), the lower semiconductor package 140 is formed (FIG. 8B), and the upper semiconductor package 60 is connected to the semiconductor package 140 (FIG. 8C). The method illustrated in FIGS. 8A to 8C in which the film is formed in the wiring board 20 reduces the risk of connection failure caused by the interference between the wiring board 70 and the resin layer 130.

However, the semiconductor devices obtained by the methods as illustrated in FIGS. 7A to 7C and 8A to 8C may be increased in thickness. Furthermore, changes in the structure of the wiring board 20 caused by the formation of the additional film 24 as illustrated in FIGS. 8A to 8C may lead to an increase in the cost of the wiring board 20, and thereby to an increase in the cost of the entire semiconductor device.

In addition, in the semiconductor devices obtained by the methods as illustrated in FIGS. 7A to 7C and 8A to 8C, the space between the semiconductor packages 60 and 140 is hollow although the semiconductor packages 60 and 140 are interconnected by the bumps 90. This may lead to insufficient impact resistance and connection reliability.

An additional intermediate substrate that does not interfere with the lower element unit including the semiconductor element 30 may be provided, and the upper element unit such as the semiconductor package 60 may be stacked thereon. In this method, however, the thickness of the semiconductor device is increased due to the intermediate substrate, and the cost of the semiconductor device may be increased. Alternatively, the connecting terminals used to connect the element units may be formed on the lower element unit after the lower element unit is sealed using resin, or the semiconductor element of the lower element unit may be embedded in the wiring board. However, these methods may also lead to, for example, an increase in the thickness of the semiconductor device and an increase in the cost.

Meanwhile, connection failure caused by the interference described as above is avoidable in the methods illustrated in FIGS. 4A to 4E and 5A to 5E, and the semiconductor device 10 having high connection reliability may be realized with the least increase in the size and the cost of the device.

That is, in the method illustrated in FIGS. 4A to 4E, the upper semiconductor package 60 is pressure-bonded to the wiring board 20 after the resin material 121 is supplied onto the wiring board 20 having the semiconductor element 30 mounted thereon. The resin material 121 spread at this moment forms the resin layer 120 occupying the space between the wiring boards 20 and 70. In the method illustrated in FIGS. 5A to 5E, the upper semiconductor package 60 is pressure-bonded to the wiring board 20 having the semiconductor element 30 mounted thereon, and the resin material 121 is then applied to the entire space between the wiring boards 20 and 70 so as to form the resin layer 120. The resin layer 120 seals the semiconductor element 30, and bonds the wiring boards 20 and 70 together in both methods illustrated in FIGS. 4A to 4E and 5A to 5E.

The formation of the resin layer 120 that seals the semiconductor element 30 as in the methods illustrated in FIGS. 4A to 4E and 5A to 5E may avoid the interference between the semiconductor package 60 and the resin layer 130 as illustrated in FIG. 6C and the resulting connection failure.

According to the methods illustrated in FIGS. 4A to 4E and 5A to 5E, the wiring boards 20 and 70 are accurately interconnected by the bumps 90 as long as the height of the bumps 90 exceeds a predetermined height (height from the surfaces of the conductive portions 22b to the upper ends of the wires 40 in the examples illustrated in FIGS. 4A to 4E and 5A to 5E) even when the bumps 90 are miniaturized.

In addition, according to the methods illustrated in FIGS. 4A to 4E and 5A to 5E, the electrode layer 150 formed on the conductive portions 22b of the wiring board 20 and the film 24 formed under the conductive portions 22b may be unnecessary. This reduces the risk of increasing the thickness of the semiconductor device 10, and furthermore, reduces the risk of increasing cost.

In the semiconductor device 10 formed by the methods illustrated in FIGS. 4A to 4E and 5A to 5E, the resin layer 120 seals the semiconductor element 30, and, at the same time, bonds the wiring boards 20 and 70 together. The formation of the resin layer 120 leads to the semiconductor device 10 having excellent impact resistance and connection reliability.

Although the resin layer 120 occupies the entire space between the wiring boards 20 and 70 in the description above, effects similar to those described above may be produced even when the resin layer 120 occupies a part of the space between the wiring boards 20 and 70.

Figure 9A:
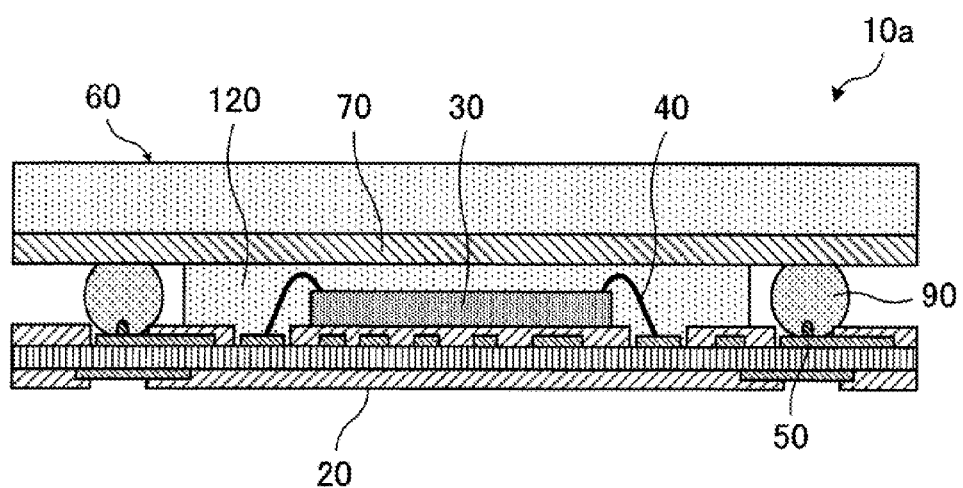
FIGS. 9A and 9B illustrate second example semiconductor devices.
Figure 9B:
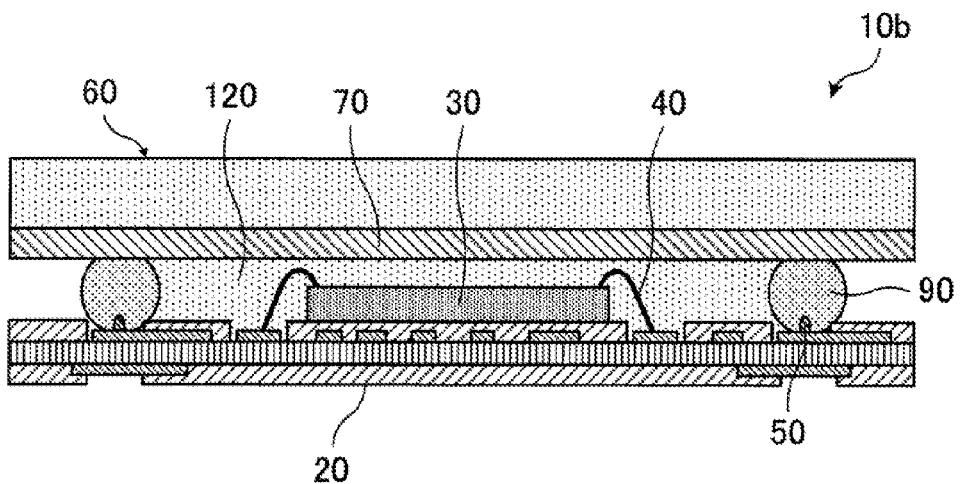

FIGS. 9A and 9B illustrate example semiconductor devices. FIGS. 9A and 9B are cross-sections of principal parts of the example semiconductor devices.

In a semiconductor device 10a illustrated in FIG. 9A, the resin layer 120 may be formed in an area inside the bumps 90 so as to seal the semiconductor element 30 and the wires 40. Furthermore, in a semiconductor device 10b illustrated in FIG. 9B, the resin layer 120 that seals the semiconductor element 30 and the wires 40 may be in contact with the bumps 90. In the semiconductor devices 10a and 10b, the resin layer 120 partially formed between the wiring boards 20 and 70 bonds the wiring boards 20 and 70 together.

The semiconductor devices 10a and 10b as illustrated in FIGS. 9A and 9B may be obtained by, for example, following the method illustrated in FIGS. 4A to 4E and by adjusting the amount of the resin material 121 to be supplied (FIG. 4D) before the upper semiconductor package 60 is pressure-bonded. For example, the semiconductor device 10a as illustrated in FIG. 9A may be obtained by reducing the amount of the resin material 121 to be supplied compared with the case illustrated in the FIG. 4D. In addition, the semiconductor device 10b as illustrated in FIG. 9B may be obtained by adjusting the amount of the resin material 121 to be supplied such that the amount is more than that in the case illustrated in FIG. 9A and less than that in the case illustrated in FIG. 4D. The bumps 90 may function as dams that block the resin material 121 from flowing to the outside during pressure-bonding of the semiconductor package 60 depending on, for example, the viscosity of the resin material 121 and the pitch and the size of the bumps 90.

Even when the resin layer 120 is formed such that the bumps 90 are at least partially exposed to the outside as illustrated in FIGS. 9A and 9B, effects similar to those produced by the semiconductor device 10 may be obtained.

The semiconductor device 10 and the like described above may be used as those of the land grid array (LGA) type. In addition, the semiconductor device 10 and the like may be those of the ball grid array (BGA) type.

Figure 10A:
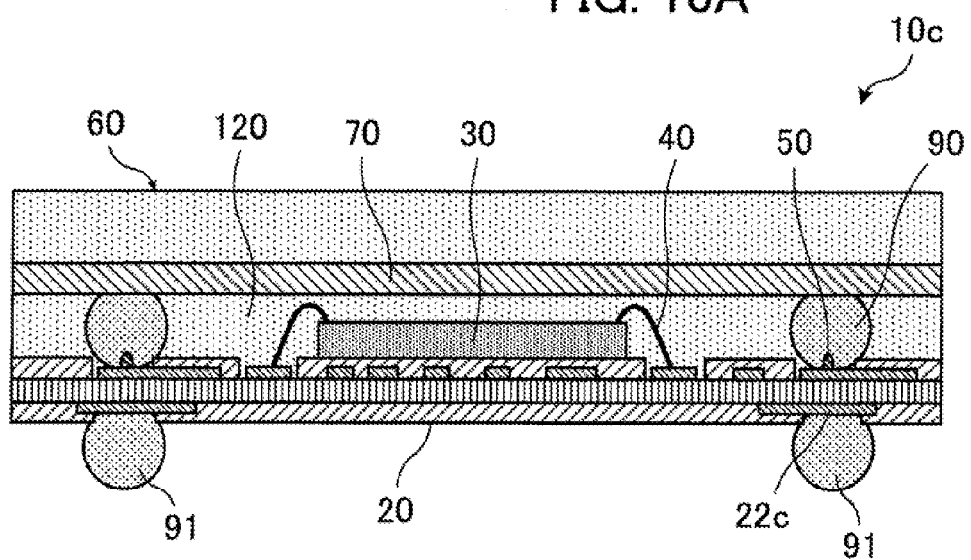
FIGS. 10A and 10B illustrate third example semiconductor devices of the BGA type.
Figure 10B:
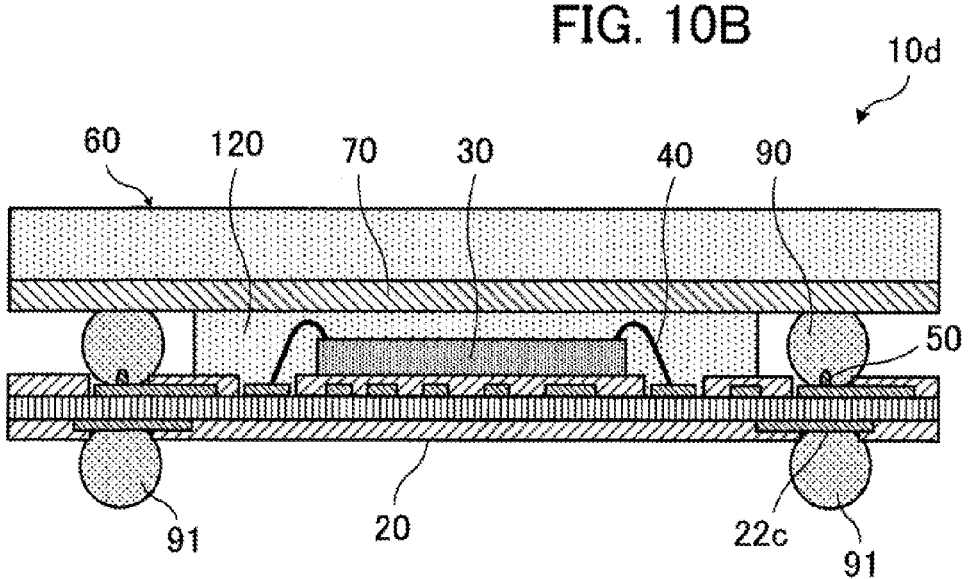

FIGS. 10A and 10B illustrate example semiconductor devices of the BGA type. FIGS. 10A and 10B are schematic cross-sections of principal parts of the example semiconductor devices of the BGA type.

A semiconductor device 10c illustrated in FIG. 10A has a BGA structure including the semiconductor device (including the resin layer 120 occupying the entire space between the wiring boards 20 and 70) illustrated in FIG. 2 and bumps 91 such as solder balls for external connection deposited on the conductive portions 22c of the wiring board 20.

A semiconductor device 10d illustrated in FIG. 10B has a BGA structure including the semiconductor device 10a (including the resin layer 120 occupying a part of the space between wiring boards 20 and 70) illustrated in FIG. 9A and the bumps 91 deposited on the conductive portions 22c of the wiring board 20. The semiconductor device 10b illustrated in FIG. 9B may also have a similar BGA structure.

The semiconductor devices 10c and 10d having the above-described BGA structures may be formed in this manner.

In addition, the semiconductor devices 10c and 10d, for example, may be mounted on other wiring boards such as mother boards and interposers using the bumps 91 deposited on the wiring board 20 to form electronic apparatuses.

FIGS. 11A and 11B illustrate example electronic apparatuses. FIGS. 11A and 11B are schematic cross-sections of principal parts of the example electronic apparatuses.

An electronic apparatus 200a illustrated in FIG. 11A includes the semiconductor device 10c (including the resin layer 120 occupying the entire space between the wiring boards 20 and 70), a wiring board 210, and an underfill member 220. Although not illustrated, the wiring board 210 includes single-layered or multi-layered conductive portions including wiring patterns and insulating portions interposed between the conductive portions. The semiconductor device 10c is electrically connected (flip-chip bonded) to the wiring board 210 by the bumps 91. The underfill member 220 is formed so as to occupy the space between the semiconductor device 10c and the wiring board 210 interconnected as above.

An electronic apparatus 200b illustrated in FIG. 11B differs from the electronic apparatus 200a illustrated in FIG. 11A in that the electronic apparatus 200b includes the semiconductor device 10d (including the resin layer 120 occupying a part of the space between the wiring boards 20 and 70). In the electronic apparatus 200b, the underfill member 220 also occupies the space between the wiring boards 20 and 70 in the semiconductor device 10d other than the space occupied by the resin layer 120 in addition to the space between the semiconductor device 10d and the wiring board 210 interconnected by the bumps 91. A similar electronic apparatus may also be formed using the semiconductor device 10b illustrated in FIG. 9B.

The use of, for example, the semiconductor devices 10c and 10d reduces the risk of connection failure, and leads to electronic apparatuses having excellent impact resistance and connection reliability.

Although the semiconductor element 30 is connected by the wires 40 to the lower wiring board 20 included in, for example, the semiconductor devices 10, 10a, 10b, 10c, and 10d in the examples above, the semiconductor element may be flip-chip bonded to the wiring board 20.

Figure 12A:
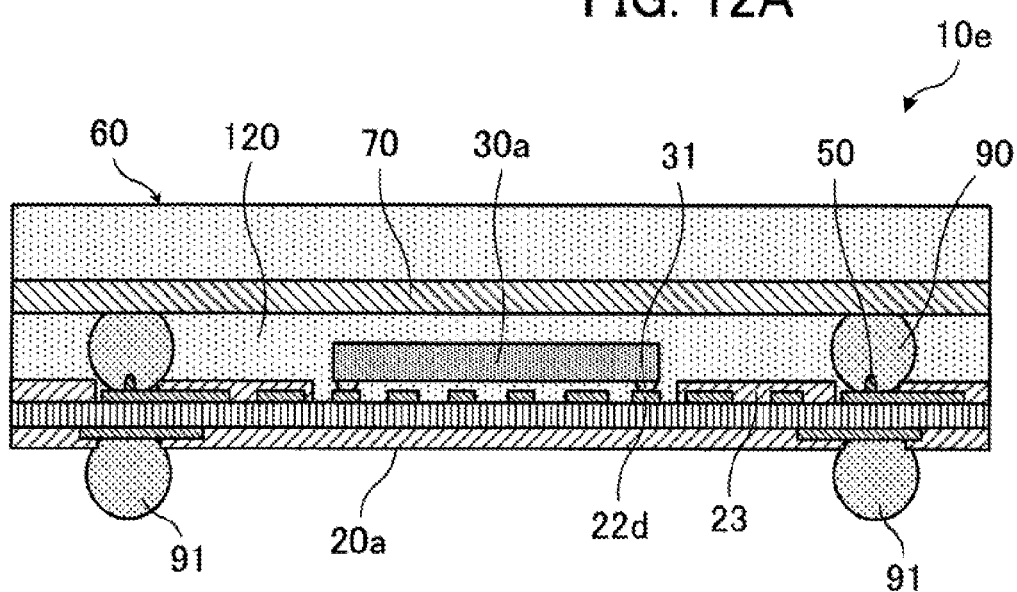
FIGS. 12A and 12B illustrate first example semiconductor devices including flip-chip bonded structures.
Figure 12B:
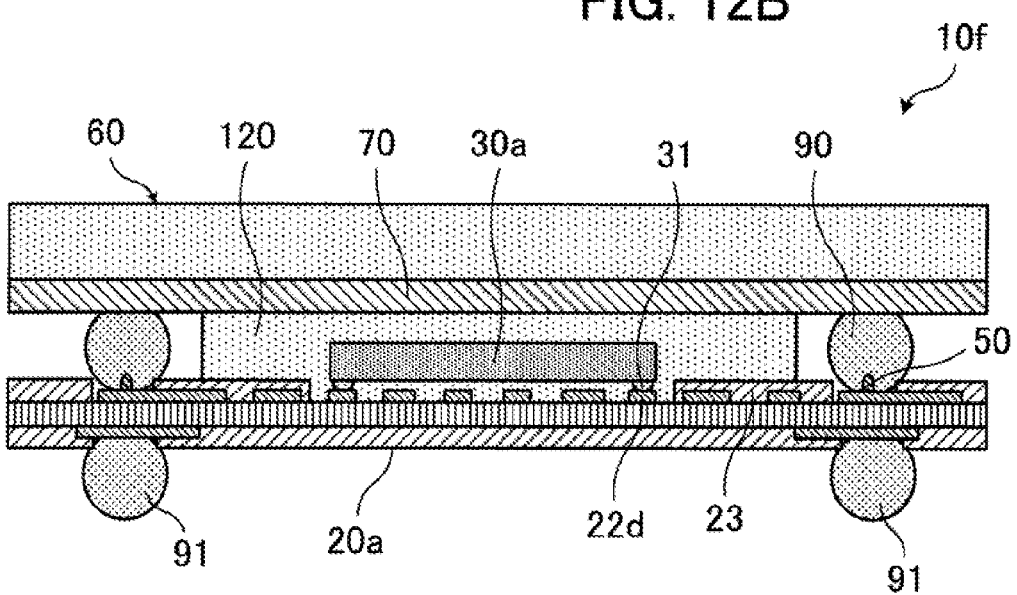

FIGS. 12A and 12B illustrate example semiconductor devices including flip-chip bonded structures. FIGS. 12A and 12B are schematic cross-sections of principal parts of the example semiconductor devices.

A semiconductor device 10e illustrated in FIG. 12A includes a semiconductor element 30a having bumps 31 such as solder balls deposited thereon and a wiring board 20a having conductive portions (pad) 22d exposed through the upper protective film 23 at positions corresponding to the bumps 31 of the semiconductor element 30a. The semiconductor element 30a is disposed on the wiring board 20a, and is flip-chip bonded to the wiring board 20a by the connection between the bumps 31 and the conductive portions 22d.

In the semiconductor device 10e, the semiconductor package 60 is disposed over the element unit including the semiconductor element 30a flip-chip bonded to the wiring board 20a, and connected to the element unit by the bumps 90. In addition, the resin layer 120 occupies the entire space between the wiring boards 20a and 70 so as to seal the semiconductor element 30a and so as to bond the wiring boards 20a and 70 together.

A semiconductor device 10f illustrated in FIG. 12B differs from the semiconductor device 10e illustrated in FIG. 12A in that the resin layer 120 occupies a part of the space between the wiring boards 20a and 70. Although the resin layer 120 is separated from the bumps 90 in the example illustrated in FIG. 12B, the resin layer 120 may be in contact with the bumps 90.

In the semiconductor devices 10e and 10f, for example, the resin layer 120 bonds the wiring boards 20a and 70 together. This leads to higher impact resistance and connection reliability compared with the case where the resin layer 120 is not formed. Furthermore, the space between the lower and upper element units is not necessarily filled with an additional underfill material, which may be used in cases where the resin layer 120 is not formed, to increase connection reliability. In addition, the resin layer 120 eliminates the need for the additional underfill material filling the space between the wiring boards 20a and 70 or the space between the semiconductor element 30a in the lower element unit and the wiring board 20a. That is, the resin layer 120 may be used as an adhesive for bonding the wiring boards 20a and together, and at the same time, as an underfill material applied between the semiconductor element 30a and the wiring board 20a.

In the description above, the semiconductor package 60 as illustrated in FIG. 3A is used as the upper element unit in, for example, the semiconductor devices 10, 10a, 10b, 10c, 10d, 10e, and 10f. In addition to this, the above-described technique is also applicable to cases where semiconductor package 160 as illustrated in FIG. 3B is used.

Figure 3B:
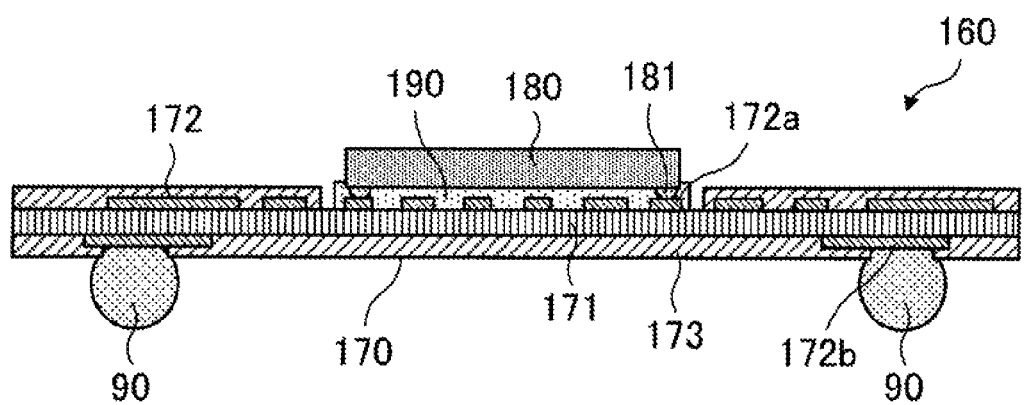

The semiconductor package 160 illustrated in FIG. 3B includes a wiring board 170 and a semiconductor element 180 mounted on the wiring board 170. The bumps 90 are deposited on a surface of the wiring board 170 opposite to that on which the semiconductor element 180 is mounted.

The wiring board 170 of the semiconductor package 160 includes a core substrate 171, conductive portions 172 disposed on the top and bottom surfaces of the core substrate 171, and insulating protective films 173. The core substrate 171 may be, for example, a single core layer or a multi-layered wiring film including single-layered or multi-layered conductive portions disposed on the top and bottom surfaces of a core layer and insulating portions interposed between the conductive portions. Among the conductive portions 172 of the wiring board 170, some of conductive portions 172a and 172b exposed through the protective films 173 on the top and bottom surfaces function as pads.

In the semiconductor package 160 illustrated in FIG. 3B, the semiconductor element 180 is flip-chip bonded to the wiring board 170 by bumps 181 such as solder balls. The bumps 181 are connected to the conductive portions 172a exposed through the protective film 173 on the top surface of the wiring board 170. The space between the wiring board 170 and the semiconductor element 180 is filled with an underfill material 190. The bumps 90 are connected to the conductive portions 172b exposed through the protective film 173 on the bottom surface of the wiring board 170.

Figure 13A:
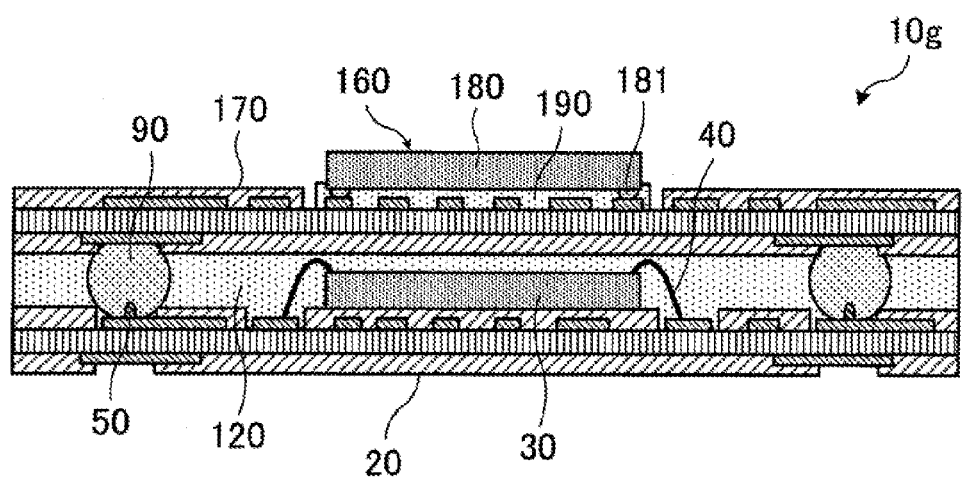
FIGS. 13A and 13B illustrate second example semiconductor devices including flip-chip bonded structures.
Figure 13B:
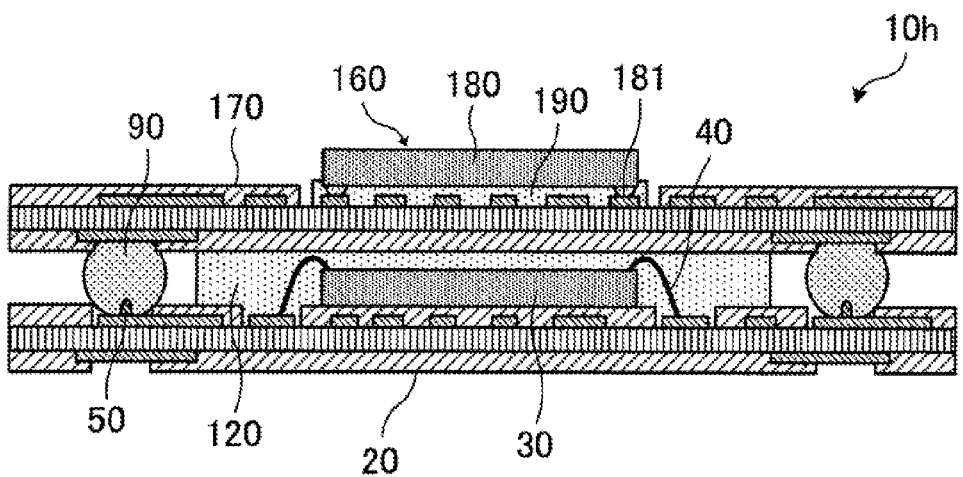

FIGS. 13A and 13B illustrate example semiconductor devices including flip-chip bonded structures. FIGS. 13A and 13B are schematic cross-sections of principal parts of the example semiconductor devices.

A semiconductor device 10g illustrated in FIG. 13A differs from the semiconductor device 10 illustrated in FIG. 2 in that the semiconductor device 10g includes the semiconductor package 160 as illustrated in FIG. 3B instead of the semiconductor package 60 as illustrated in FIG. 3A.

A semiconductor device 10h illustrated in FIG. 13B differs from the semiconductor device 10a illustrated in FIG. 9A in that the semiconductor device 10h includes the semiconductor package 160 as illustrated in FIG. 3B instead of the semiconductor package 60 as illustrated in FIG. 3A.

The semiconductor devices 10g and 10h may also be formed by using the semiconductor package 160 by following the methods illustrated in FIGS. 4A to 4E and 5A to 5E. That is, the semiconductor package 160 is stacked on the lower element unit including the semiconductor element 30 mounted on the wiring board 20, the wiring boards 20 and 170 are electrically interconnected by the bumps 50 and 90, and the resin layer 120 is formed so as to occupy the space between the wiring boards 20 and 170. The semiconductor devices 10g and 10h also produce effects similar to those produced by the above-described semiconductor device 10.

The semiconductor package 160 may also be adopted in the semiconductor devices 10b, 10c, 10d, 10e, and 10f instead of the semiconductor package 60.

Although each of the upper and lower element units includes a semiconductor element (the semiconductor element 30 or 80, or the semiconductor element 30 or 180), the number of the semiconductor element is not limited to this. The lower element unit may include a plurality of semiconductor elements mounted on the wiring board 20, or the upper element unit may include a plurality of semiconductor elements mounted on the wiring board 70 or 170.

The above-described semiconductor devices may include various types of semiconductor elements such as logic devices and memory devices. For example, a logic device is used as the semiconductor element 30 of the lower element unit, and a memory device is used as the semiconductor element 80 or 180 of the upper element unit in the semiconductor devices.

Next, methods of forming semiconductor devices will be further described. In the descriptions below, methods of forming the semiconductor device 10 illustrated in FIG. 2 and the semiconductor device 10c illustrated in FIG. 10A will be described as first to third examples.

The first example will now be described.

FIGS. 14A to 14G illustrate the first example method of forming semiconductor devices. FIGS. 14A to 14G are schematic cross-sections of principal parts in steps of forming the semiconductor devices.

First, a large wiring board 20A capable of accommodating a plurality of (for example, four) semiconductor elements 30 as illustrated in FIG. 14A is prepared. Although not illustrated, the wiring board 20A has a structure similar to that of the wiring board 20 as illustrated in FIGS. 2, 10A, and 10B so as to correspond to the semiconductor elements 30 to be placed. The semiconductor elements 30 are placed on the wiring board 20A using a die attach material (not illustrated).

Next, as illustrated in FIG. 14B, the semiconductor elements 30 placed on the wiring board 20A are connected to predetermined portions (the conductive portions 22a illustrated in, for example, FIG. 2) of the wiring board 20A by, for example, Au wires 40. With this, the semiconductor elements 30 are mounted on the wiring board 20A. Subsequently, as illustrated in FIG. 14C, bumps 50 are deposited on predetermined portions (the conductive portions 22b illustrated in, for example, FIG. 2) on a surface, having the semiconductor elements 30 mounted thereon, of the wiring board 20A. The bumps 50 may be, for example, Au stud bumps.

Next, as illustrated in FIG. 14D, a liquid or powdered resin material 121 is supplied on the semiconductor elements 30 mounted on the wiring board 20A. In cases where the resin material 121 is liquid, for example, a predetermined amount of the liquid resin material 121 may be dropped at the positions of the semiconductor elements 30 on the wiring board 20A. In cases where the resin material 121 is powdered, for example, a predetermined amount of the powdered resin material 121 is disposed at the positions of the semiconductor elements 30 on the wiring board 20A. The amount of the resin material 121 to be supplied is set such that the resin material 121 fills the spaces between the wiring board 20A and wiring boards 70 when semiconductor packages 60 including the wiring boards 70 are pressure-bonded to the wiring board 20A as described below.

Next, as illustrated in FIG. 14E, the semiconductor packages 60 located above the wiring board 20A are pressure-bonded to the wiring board 20A while being heated such that bumps 90 (for example, solder balls) deposited on the semiconductor packages 60 are connected to the bumps 50 (for example, Au stud bumps) deposited on the wiring board 20A.

The semiconductor packages 60 may be pressure-bonded using a flip-chip bonder. The flip-chip bonder places the semiconductor packages 60 over the wiring board 20A such that the bumps 90 are aligned with the bumps 50 (the conductive portions 22b illustrated in, for example, FIG. 2), and pressure-bonds the semiconductor packages 60 to the wiring board 20A. The flip-chip bonder may have heating mechanisms in a stage on which the wiring board 20A is placed and in a collet that holds (by, for example, adhesion) and conveys the semiconductor packages 60. The semiconductor packages 60 may be heated by either or both of the stage and the collet during pressure-bonding. The temperature at which the semiconductor packages 60 are pressure-bonded may be set such that the bumps 90 of the semiconductor packages 60 are schematically softened for the bumps 50 of the wiring board 20A to bite into the bumps 90, for example, for the bumps 50 to break through oxide films potentially generated on the surfaces of the bumps 90.

The semiconductor packages 60 are pressure-bonded such that the resin material 121 fills the spaces between the wiring boards 20A and 70. In cases where the resin material 121 is liquid, the temperature at which the semiconductor packages 60 are pressure-bonded is set such that the resin material 121 remains fluid and is not cured. In cases where the resin material 121 is powdered, the temperature at which the semiconductor packages 60 are pressure-bonded is set such that the resin material 121 is melted and becomes fluid.

When the semiconductor packages 60 are pressure-bonded, the fluid resin material 121 is spread such that the semiconductor packages 60 are connected to the wiring board 20A and such that the resin material 121 fills the spaces between the wiring boards 20A and 70 as illustrated in FIG. 14E. The resin material 121 may be cured by being heated during the pressure-bonding of the semiconductor packages 60 or by being cooled after the heating depending on the properties of the material. Alternatively, the resin material 121 may be cured by being irradiated with, for example, ultraviolet rays. The resin material 121 forms a resin layer 120A when cured. The resin layer 120A seals the semiconductor elements 30, and at the same time, bonds the wiring board 20A and the wiring boards 70 together.

At this moment, the resin layer 120A does not necessarily need to be completely cured, and may be semicured. The semicured resin layer 120A may be subjected to an additional curing process. For example, in cases where the resin layer 120A (resin material 121) is composed of a thermosetting resin and is semicured, the resin layer 120A may be subjected to an additional curing process. A reflow process (described below) performed after formation of bumps 91 may also serve as the curing process.

In view of bondability of the bumps 90 to the bumps 50, the bumps 90 may be reflowed at a temperature depending on the properties of the material after the semiconductor packages 60 are pressure-bonded as above.

After the semiconductor packages 60 are connected to the wiring board 20A using the bumps 90 and the resin layer 120A, for example, as illustrated in FIG. 14F, the bumps 91 (for example, solder balls) are deposited on the wiring board 20A. The bumps 91 are deposited on the bottom surface (surface opposite to that on which the semiconductor packages 60 lie) of the wiring board 20A at predetermined positions (the conductive portions 22c illustrated in, for example, FIG. 2). After the formation of the bumps 91, a reflow process is carried out. In this manner, the BGA structure as illustrated in FIG. 14F is obtained.

Subsequently, the wiring board 20A and the resin layer 120A are diced at positions indicated by dotted lines in FIG. 14F. This completes the formation of semiconductor devices 10c of the BGA type each including a split wiring board 20 and a split resin layer 120.

Semiconductor devices 10 of the LGA type may also be obtained by dicing the resin layer 120A and the wiring board 20A without depositing the bumps 91 illustrated in FIG. 14F.

Next, the second example will be described.

FIGS. 15A to 15D illustrate the second example method of forming semiconductor devices. FIGS. 15A to 15D are schematic cross-sections of principal parts in steps of forming the semiconductor devices.

Figure 15A:
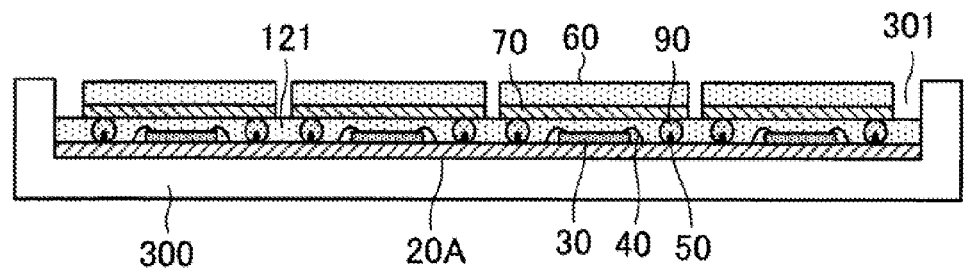
FIGS. 15A to 15D illustrate a second example method of forming semiconductor devices.

In this second example, the steps illustrated in FIGS. 14A to 14D in the first example are performed in the same way. Subsequent to the step illustrated in FIG. 14D, the wiring board 20A on which the resin material 121 is supplied is disposed in a recess 301 of a jig (lower jig) 300 as illustrated in FIG. 15A. Subsequently, the semiconductor packages 60 are pressure-bonded to the wiring board 20A using, for example, a flip-chip bonder such that the bumps 50 and 90 are interconnected. The semiconductor packages 60 may be heated during the pressure-bonding.

When the semiconductor packages 60 are pressure-bonded, the resin material 121 is spread in the spaces between the wiring boards 20A and 70. At this moment, the lower jig 300 as illustrated in FIG. 15A reduces the risk that the resin material 121 may flow to the outside of the wiring board 20A in this second example.

Figure 15B:
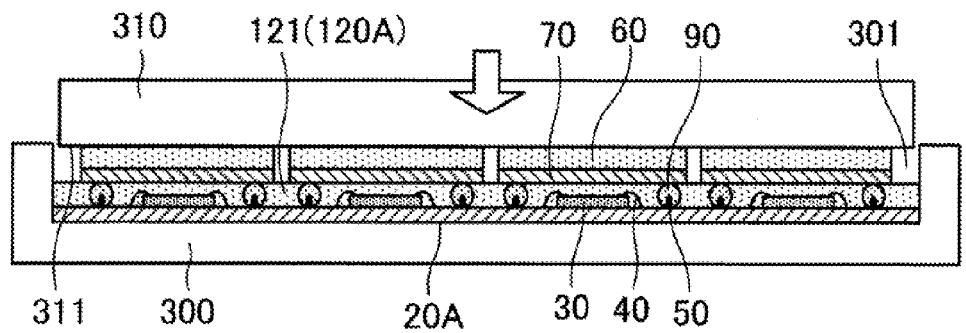

Next, the semiconductor elements 30 on the wiring board 20A are pressed in a collective manner while being heated by a jig (upper jig) 310 having a pushing surface 311 and including a heating mechanism (not illustrated) as illustrated in FIG. 15B. With this, the bumps 90 of the semiconductor packages 60 are connected to the bumps 50 of the wiring board 20A, and at the same time, the resin material 121 spread in the entire spaces between the wiring boards 20A and 70 is completely cured (or semicured). At this moment, the lower jig 300 also reduces the risk that the resin material 121 may flow to the outside. The resin material 121 filling the spaces between the wiring boards 20A and 70 forms the resin layer 120A when cured. The resin layer 120A seals the semiconductor elements 30, and at the same time, bonds the wiring boards 20A and 70 together.

After this, the resin layer 120A may be subjected to an additional curing process, or the bumps 90 may be reflowed.

Figure 15C:
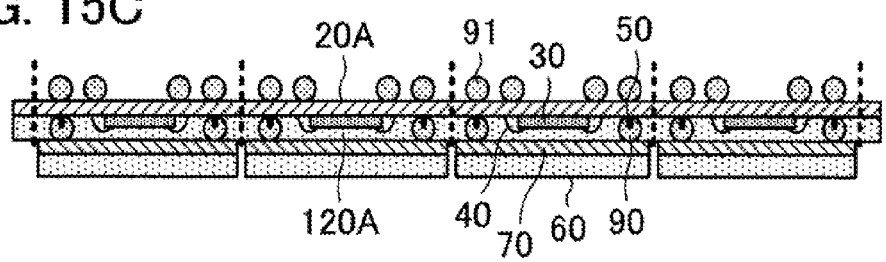
Figure 15D:
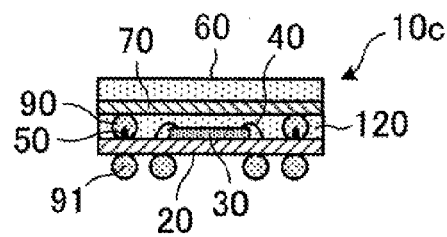

Subsequently, as in the first example, the bumps (for example, solder balls) are deposited on the wiring board 20A as illustrated in FIG. 15C, and the wiring board 20A and the resin layer 120A are diced at positions indicated by dotted lines in FIG. 15C after the reflow process. This completes the formation of the semiconductor devices 10c of the BGA type as illustrated in FIG. 15D each including the split wiring board 20 and the split resin layer 120.

The semiconductor devices 10 of the LGA type may also be obtained by dicing the resin layer 120A and the wiring board 20A without depositing the bumps 91 illustrated in FIG. 15C.

Next, the third example will be described.

FIGS. 16A to 16G illustrate the third example method of forming semiconductor devices. FIGS. 16A to 16G are schematic cross-sections of principal parts in steps of forming the semiconductor devices.

In the third example, a plurality of semiconductor elements 30 are first placed on the wiring board 20A as illustrated in FIG. 16A, the semiconductor elements 30 are connected to the wiring board 20A by the wires 40 as illustrated in FIG. 16B, and the bumps 50 are deposited on the wiring board 20A as illustrated in FIG. 16C as in the first example.

The semiconductor packages 60 are then pressure-bonded to the wiring board 20A as illustrated in FIG. 16D such that the bumps 90 are connected to the bumps 50. The semiconductor packages 60 may be pressure-bonded using a flip-chip bonder. The flip-chip bonder may include a stage and a collet with heating mechanisms, and the semiconductor packages 60 may be pressure-bonded to the wiring board 20A while being heated by the flip-chip bonder. In addition, a reflow process may be carried out after the semiconductor packages 60 are pressure-bonded to the wiring board 20A.

After the semiconductor packages 60 are pressure-bonded to the wiring board 20A, the spaces between the wiring boards 20A and 70 are filled with the liquid resin material 121 as illustrated in FIG. 16E. For example, the resin material 121 may be injected from an end of the wiring board 20A into the spaces between the wiring boards 20A and 70. The resin material 121 filling the spaces forms the resin layer 120A when cured by a method depending on the properties of the material. The resin layer 120A seals the semiconductor elements 30 and, at the same time, bonds the wiring board 20A and the wiring boards 70 together. After this, the resin layer 120A may be subjected to an additional curing process, and the bumps 90 may be reflowed.

Subsequently, as in the first example, the bumps (solder balls) are deposited on the wiring board 20A as illustrated in FIG. 16F, and the wiring board 20A and the resin layer 120A are diced at positions indicated by dotted lines in FIG. 16F after the reflow process. This completes the formation of the semiconductor devices 10c of the BGA type as illustrated in FIG. 16G each including the split wiring board 20 and the split resin layer 120.

The semiconductor devices 10 of the LGA type may also be obtained by dicing the resin layer 120A and the wiring board 20A without depositing the bumps 91 illustrated in FIG. 16F.

As described above, the upper element unit including the semiconductor element mounted on the wiring board is stacked on the lower element unit similarly including the semiconductor element mounted on the wiring board. Both element units are electrically interconnected by connecting portions such as bumps, and are bonded together by the resin layer interposed therebetween. This resin layer bonds the lower and upper element units together, and at the same time, seals the semiconductor element included in the lower element unit. The adoption of this structure facilitates a reduction in the pitch and size of the connecting portions, and leads to semiconductor devices with high connection reliability.

Consequently, the above-described semiconductor devices may be manufactured with the least increase in cost, and have high connection reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the spirit and scope of the invention.

What is claimed is:

1. A semiconductor device comprising:
   a first wiring board;
   a first semiconductor element mounted on the first wiring board;
   a second wiring board disposed over the first semiconductor element;
   a second semiconductor element mounted on the second wiring board;
   a connecting portion disposed between the first wiring board and the second wiring board so as to electrically connect the first wiring board and the second wiring board;
   a first resin layer disposed between the first wiring board and the second wiring board so as to seal the first semiconductor element and so as to bond the first wiring board and the second wiring board together; and
   a second resin layer that seals the second semiconductor element; wherein
   the connecting portion includes a first protruding electrode provided for the first wiring board and a second protruding electrode provided for the second wiring board and connected to the first protruding electrode; and
   the first protruding electrode bites into the second protruding electrode.

2. The semiconductor device according to claim 1, wherein the first resin layer is a single layer.

3. The semiconductor device according to claim 1, wherein the connecting portion is sealed by the first resin layer.

4. The semiconductor device according to claim 1, wherein the connecting portion is at least partially exposed through the first resin layer.

5. A method of manufacturing a semiconductor device, the method comprising:
   mounting a first semiconductor element on a first wiring board;
   supplying a resin material on the first semiconductor element;
   after the supplying of the resin material, placing a second wiring board over the first semiconductor element, a second semiconductor element being mounted on the second wiring board;
   electrically connecting the first wiring board and the second wiring board using a connecting portion disposed between the first wiring board and the second wiring board; and
   sealing the first semiconductor element and bonding the first wiring board and the second wiring board together using the resin material disposed between the first wiring board and the second wiring board by pressure-bonding with heating.

6. An electronic apparatus comprising:
   a semiconductor device including
   a first wiring board,
   a first semiconductor element mounted on the first wiring board,
   a second wiring board disposed over the first semiconductor element,
   a second semiconductor element mounted on the second wiring board,
   a connecting portion disposed between the first wiring board and the second wiring board so as to electrically connect the first wiring board and the second wiring board,
   a first resin layer disposed between the first wiring board and the second wiring board so as to seal the first semiconductor element and so as to bond the first wiring board and the second wiring board together, and
   a second resin layer that seals the second semiconductor element; and
   a third wiring board on which the semiconductor device is mounted; wherein
   the connecting portion includes a first protruding electrode provided for the first wiring board and a second protruding electrode provided for the second wiring board and connected to the first protruding electrode; and
   the first protruding electrode bites into the second protruding electrode.

7. The method according to claim 5, wherein:
   the connecting portion includes a first protruding electrode provided for the first wiring board and a second protruding electrode provided for the second wiring board and connected to the first protruding electrode; and
   the electrically connecting of the first wiring board and the second wiring board includes making the first protruding electrode to bite into the second protruding electrode.

* * * * *